June 24, 1969 F. J. RINALDI 3,452,149

FLEXIBLE ELECTRICAL CONNECTOR

Filed Oct. 30, 1967

INVENTOR.
FRED J. RINALDI

BY

Hopgood & Calimafde

ATTORNEYS

United States Patent Office 3,452,149

Patented June 24, 1969

3,452,149

FLEXIBLE ELECTRICAL CONNECTOR

Fred J. Rinaldi, 63 Wakelee Road, Wolcott, Conn. 06525

Filed Oct. 30, 1967, Ser. No. 679,141
Int. Cl. H05k *1/10*
U.S. Cl. 174—68.5 7 Claims

ABSTRACT OF THE DISCLOSURE

A flexible electrical connector for connecting circuitry on opposing sides of a printed circuit board or the like, and capable of receiving a lead wire for connection to such circuitry. The connector consists essentially of a wire mesh cylinder passing through the circuit board, the ends of which are electrically connected to the circuit components.

*Background*

The invention is in the field of electrical connectors and more specifically in the art of eyelet through connections for printed circuit boards.

Through connections on circuit boards are presently being made principally by plating through a hole in the board or by fusing or soldering a solid metal eyelet disposed in the hole to the circuitry on opposite sides of the board. Recently, a force fitted insulating pin enclosed in braided conducting wires has been tried, see U.S. Patent 3,268,652.

A primary problem with all present-day connectors is their lack of ability to withstand temperature cycling, vibration, and mechanical shock, encountered in assembly and use of circuit boards on which they are installed without degradation of the connection so achieved.

Experience and testing indicate that of the connectors presently in use, the plated through hole has the greatest proven resistance to thermal shock. However, such connections suffer from discontinuities created by voids which develop in the plating material during the plating process, necessitating extensive inspection of such connections. This inspection is made difficult by the fact that such continuities are hidden within the bulk of the connection. Solid metal eyelet connectors on the other hand are easily inspected, but suffer from the inability to withstand thermal and mechanical shock.

A further problem exists in obtaining a reliable through connection which is also capable of receiving a lead wire.

The difficulty encountered in inserting a force fitted pin or plug with wires wrapped around it into the circuit board aperture limits the utility of these connectors. Such insertion is a relatively complicated operation and requires special machinery; further, the production of the wire wrapped plug is itself a complicated process.

*Summary of the invention*

Basically, the invention consists of a cylinder of interwoven conducting wires connecting the circuitry on opposite sides of a circuit board, and into which a lead wire may be inserted and connected.

A primary objective of the invention is to provide a connector with three dimensional flexibility, which has the advantage of being capable of withstanding thermal expansion and contraction of the circuit board and circuitry to which it is connected, as well as any other mechanical stresses to which it may be subjected. This objective and its resulting advantage is achieved by utilizing a wire mesh structure which may be fused or soldered to circuit elements.

In the form of a wire mesh eyelet drawn from flat mesh stock, the connector is preconditioned by the drawing process to possess areas where the wire thereof are compressed, and areas where the wires thereof are under tensile stress; further, such areas are quadrantially disposed. The existence of such diverse stress patterns in multiplicity within a single connector contribute to its superior flexibility and ability to withstand distortion from any source.

When soldered in place, such a structure exhibits characteristics similar to those of a plated-through connector; in that the solder is free to adjust to the expansion and contraction of the circuit board assembly with significant temperature variations. Since solder has a low melting point, it becomes soft at about 200° F. and is soft and pliable before the circuit board assembly becomes hot enough to cause destructive distortion. Just as the solder of the plated-through connector will move to accommodate board distortion, the soft solder moves through the holes in the wire mesh to relieve any pressure that might otherwise develop between the eyelet and the solder.

When the structure is fused to the circuitry, the wires disposed within the aperture are completely unencumbered and free to absorb any distortion of the board.

Another objective of the invention is to provide a through connector into which a lead wire can be inserted, without adversely effecting the aforementioned advantages of flexibility. Such a connector offers the advantage of simplifying the assembly of circuit boards.

The invention has an additional advantage of being a self-supporting unit; its shape is set during manufacture, so that it will hold its form throughout the installation process and can be machine fed much as a solid metal eyelet. The flexibility of the eyelet permits forced fit insertion, or sliding insertion followed by interior expansion upon flanging.

A still further advantage of the invention is that it provides a dual connection between the circuit elements; first, a direct wire connection between the circuit elements, and second, a solder connection between these elements. This effect is achieved by the wicking of the solder through the wire mesh and between the wire mesh and the walls of the hole in the circuit board. This wicking action further contributes to the excellent solderability characteristics of the connector. It is important to note that although the hot solder will wick through the hole, it will not force its way between the barrel of the eyelet and the side wall, as the holes in the mesh provide ample area for dispersion.

Another advantage of the connector of the invention is that it is lighter in weight than the solid eyelet connectors or the plated-through connection.

Furthermore, the connector can be used simply as a circuit terminal for a lead wire, offering the aforementioned advantages of flexibility and solderability.

Other advantages, objectives and various further features of novelty and invention will be pointed out or will occure to those skilled in the art from a reading of the following specification in conjunction with the accompanying drawings which together describe a preferred embodiment of the invention.

*Brief description of the preferred embodiment*

Figure 1:
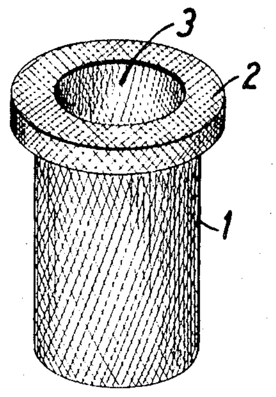
FIGURE 1 is a perspective view of the novel connector prior to installation.

FIG. 1 illustrates the preferred embodiment of the invention in the form of a wire mesh eyelet. The eyelet is formed from an integral piece of wire mesh and includes the barrel or body 1, which is expanded at one end to form a flange 2. The body 1 is cylindrical in form having an annular passage 3 through the center so that the eyelet is hollow. The wire mesh may vary in grade, temper, and ductility corresponding to the needs of the user. However, experience has shown that grade 100 copper mesh is quite satisfactory. The wire mesh may also be plated with the material of the circuitry which will enable fusing of the connector to the circuit elements.

Figure 2:
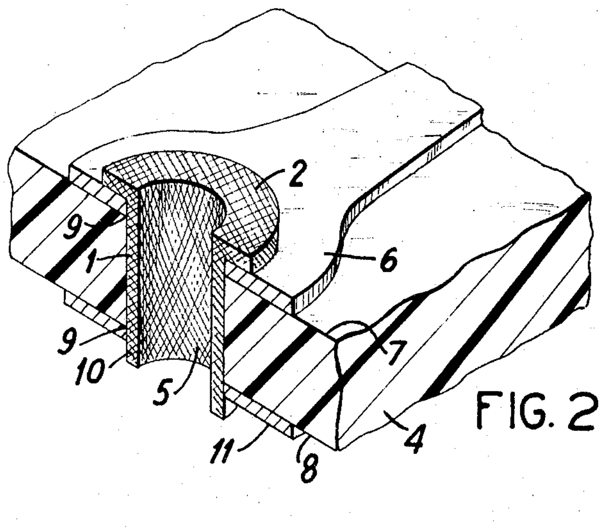
FIG. 2 is a cut-away perspective view of the connector in partially formed condition in position of a circuit board.

FIG. 2 illustrates the connector after being placed in position for connection to a printed circuit board. The board consists of a support panel 4 of insulating material. A cylindrical aperture or hole 5 is provided in the support panel 4.

The circuit elements 6 and 11 to be connected are mounted to upper and lower surfaces 7 and 8 respectively of support panel 4 and lie adjacent to the edges 9 of the aperture 5. The outside diameter of the barrel 1 is slightly less than the diameter of hole 5.

To install the connector, the body 1 of the eyelet is inserted into aperture 5. This can be accomplished automatically by machinery in the same manner in which solid eyelets are presently inserted in boards of this type. The flange 2 comes to rest on circuit element 6 mounted on top surface of board 4. The barrel 1 of the eyelet protrudes through the lower surface 8 of the support panel by an amount sufficient to permit flanging of this lower section 10 of the barrel, into contact with circuit element 11 mounted on the lower surface 8 of support panel 4 in FIG. 3.

Figure 3:
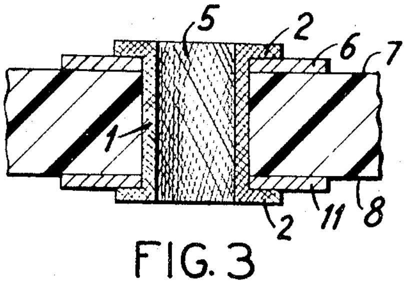
FIG. 3 is a cut-away side view of a circuit board with the connector fused in place.

FIG. 3 illustrates one embodiment of the invention in which the contact areas 2 of the wire mesh eyelet are flat-flanged and fused to circuit elements 6. It is also possible to wave-solder such a flat-flanged connector to circuit elements 6 as the wicking action of the mesh of the flanges 2 provide excellent solderability.

Figure 4:
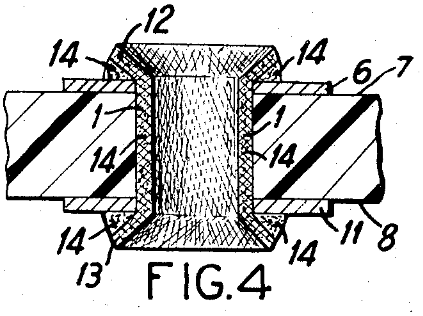
FIG. 4 is a cut-away side view of a circuit board with one form of the connector soldered in place.

FIG. 4 illustrates an alternate configuration of the wire mesh eyelet of the invention. In this embodiment the upper flange 12 and the lower flange 13 are funnel-shaped permitting solder 14 to accumulate between the flanges 12 and 13 and circuitry 6 and 11.

Figure 5:
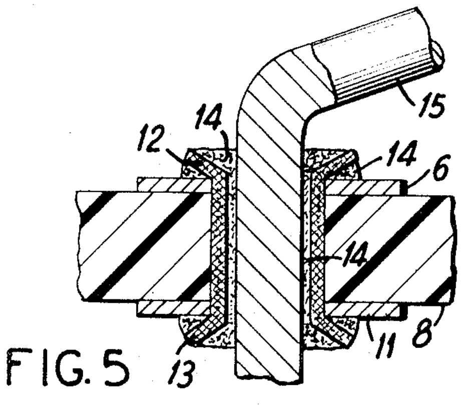
FIG. 5 is the connector of FIG. 4 with a lead wire soldered therein.

FIG. 5 illustrates the through connector of FIG. 4 with a wire lead 15 positioned therein. The diameter of the wire lead 15 may be less than the inside diameter of the barrel 1 of the eyelet in order to permit free passage of the wire through the opening. Lead 15 can be soldered in this position, without destroying the flexible character of the connection or its resistance to thermal shock.

Figure 6:
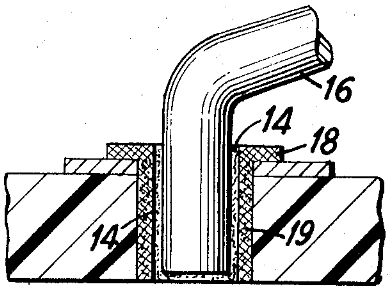
FIG. 6 is a side view of the invention employed as a flexible terminal instead of a through-connector.

FIG. 6 illustrates a further embodiment and application of the principles of the invention. In this instance, a wire mesh eyelet is used as a flexible terminal to connect a wire lead to a circuit element. The eyelet is connected by its flange 17 to the circuit element 18, as the body 19 may or may not be supported as in the case of a through connector. The lead wire 16 is inserted into the center of the mesh eyelet and soldered thereto. The abovementioned characteristics of the wire mesh render it an excellent terminal whether or not associated with a circuit board. The flextbility of the wire mesh, its solderability, and the fact that warm solder will move through the mesh provide a terminal with exceptional ability to withstand physical forces created by vibration and heat.

Figure 7:
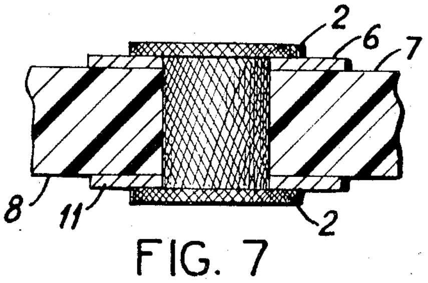
FIG. 7 is a cut-away side view of an alternate form of the invention installed on a circuit board.

FIG. 7 is an alternate form of the invention wherein the connector constitutes a solid column of wire mesh material. After insertion, the column is compressed causing the column to expand and fill the aperture.

This compression further creates flanged portions which overlay the circuit board and make contact with the circuitry thereon.

In this form the connector need not be soldered or otherwise solidly connected to the circuitry. The inherent stiffness of the wire elements of the mesh will cause the compressed column to retain its shape and maintain contact with the circuit elements under the flanged areas.

Further, a lead wire may be forced into the center of the column through the interstices of the wire mesh. So positioned, the lead wire is electrically connected to and physically retained by frictional contact with the wire elements of the mesh.

While the principles of the invention have been described in connection with the above specific apparatus, it is to be clearly understood that this description is made only by way of example and not as a limitation to the scope of the invention as set forth in the accompanying claims.

I claim:

1. An electrical circuit assembly comprising, an insulating support having a pair of opposing surfaces and an aperture therebetween, electrical circuit elements mounted upon said opposite surfaces, through-connector means extending through the aperture to connect the circuit elements on opposite sides of said support, said through-connector means consisting of a hollow cylindrical body of electrically conductive flexible wire mesh disposed within said aperture, the outside surface of which rides adjacent the walls of said communicating aperture, and the interior of which comprises a receptacle for a lead wire, flanged end portions of said cylindrical body disposed outside the ends of said aperture and in electrical contact with said circuit elements, so that a hollow flexible connection is made between said circuit elements on opposite sides of said insulating panel, to which a lead wire may be connected.

2. The electrical assembly of claim 1, wherein said through-connector means is a wire mesh eyelet.

3. The assembly of claim 2, wherein the outer diameter of the barrel of said eyelet through-connector is less than the diameter of said aperture, so that said eyelet through-connector slides freely into the aperture in said insulating support.

4. The assembly of claim 2 wherein said insulating support having opposing surfaces with electrical circuit elements thereon is a printed circuit board, said through-connector is slidably fitted into said aperture and funneled flared outwardly at both ends from the point of exit from said aperture into contact with said circuit elements, and said eyelet through-connector is soldered to said circuit elements, and wherein said assembly further includes a lead wire extending within the hollow in said wire mesh eyelet through-connector, and is soldered therein.

5. The assembly of claim 1 further comprised of a lead wire extending within said hollow wire mesh cylinder, and electrically connected to said cylinder, so that a flexible connection is achieved between the circuit elements on opposite sides of the circuit board and the lead wire.

6. An electrical circuit assembly comprising, an insulating support having a pair of opposing surfaces and a recess therein, electrical circuit elements mounted upon one of said opposing surfaces, a flexible terminal receptacle for electrically connecting a lead wire to said electrical circuit elements, comprised of: a substantially cylindrical body of electrically conducting flexible wire mesh disposed within said recess, and filling the same, and having a flanged head electrically connected to said circuit elements; and, a wire lead an end of which is inserted into said wire mesh.

7. The assembly of claim 3 wherein the wire mesh of said eyelet through-connector is of solder wicking density, and wherein solder is wicked through said aperture and connector directly connecting the circuit elements on opposite sides of said support.

References Cited

UNITED STATES PATENTS

| | | | |
|---|---|---|---|
| 1,473,362 | 11/1923 | Tilton | 16—108 XR |
| 2,434,358 | 1/1948 | Frank | 174—84.3 XR |
| 3,268,652 | 8/1966 | Burns et al. | 174—68.5 |

DARRELL L. CLAY, *Primary Examiner.*

U.S. Cl. X.R.

29—625, 626; 85—37; 339—17, 258